(12) United States Patent
Burke et al.

(10) Patent No.: US 11,800,649 B2
(45) Date of Patent: Oct. 24, 2023

(54) MOBILE DISPLAY ENCAPSULATION TO IMPROVE ROBUSTNESS AND WATER RESISTANCE

(71) Applicant: Apple Inc., Cupertino, CA (US)

(72) Inventors: Kodiak D. Burke, San Jose, CA (US); John J. Baker, Campbell, CA (US); Tyler B. Cater, San Jose, CA (US); Christopher J. Durning, Saratoga, CA (US); Benjamin J. Pope, Woodside, CA (US); Richard H. Dinh, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 311 days.

(21) Appl. No.: 16/997,753

(22) Filed: Aug. 19, 2020

(65) Prior Publication Data
US 2022/0061166 A1 Feb. 24, 2022

(51) Int. Cl.
*G06F 1/16* (2006.01)
*H05K 5/00* (2006.01)
*H05K 3/28* (2006.01)
*H05K 5/03* (2006.01)

(52) U.S. Cl.
CPC ........... *H05K 3/284* (2013.01); *G06F 1/1656* (2013.01); *H05K 5/0017* (2013.01); *H05K 5/03* (2013.01); *G06F 1/1626* (2013.01)

(58) Field of Classification Search
CPC ...... G06F 1/1626; G06F 1/163; G06F 1/1656; H05K 5/03; H05K 5/0017; H05K 3/284
See application file for complete search history.

(56) References Cited

U.S. PATENT DOCUMENTS

| | | | |
|---|---|---|---|
| 7,236,357 B2 * | 6/2007 | Chen | G06F 1/1656 361/679.55 |
| 8,773,847 B2 * | 7/2014 | Byun | H04B 1/385 368/281 |
| 8,792,249 B2 * | 7/2014 | Sasamori | H04M 1/0262 361/679.01 |
| 10,168,737 B2 * | 1/2019 | Kemppinen | G06F 1/1626 |
| 10,180,702 B2 * | 1/2019 | Dabov | G06F 1/1626 |
| 10,512,184 B2 * | 12/2019 | Cho | H05K 5/0017 |
| 10,568,218 B1 * | 2/2020 | Xu | H05K 1/189 |
| 10,788,697 B2 * | 9/2020 | Kitagawa | G02F 1/133308 |
| 11,051,412 B2 * | 6/2021 | Zeng | G06F 1/1656 |
| 11,281,259 B2 * | 3/2022 | Cha | H04M 1/02 |
| 11,284,547 B2 * | 3/2022 | Shin | H05K 1/189 |

(Continued)

FOREIGN PATENT DOCUMENTS

| | | | |
|---|---|---|---|
| DE | 3732206 A1 | 4/1989 | |
| GB | 1373962 A | 11/1974 | |
| KR | 20030082131 A | * 10/2003 | ............... G03F 1/48 |

OTHER PUBLICATIONS

Translation of the KR20030082131 (Year: 2003).*

(Continued)

*Primary Examiner* — Abhishek M Rathod
(74) *Attorney, Agent, or Firm* — DORSEY & WHITNEY LLP

(57) ABSTRACT

An electronic device including a housing defining an aperture, a display component positioned in the aperture, and a filler material at least partially surrounding a periphery of the display component. The filler material can contact the display component and a portion of the housing defining the aperture.

15 Claims, 14 Drawing Sheets

(56) References Cited

U.S. PATENT DOCUMENTS

| | | |
|---|---|---|
| 11,444,260 B2* | 9/2022 | Choi .................... H04M 1/0268 |
| 2007/0229727 A1* | 10/2007 | Yamazaki ............. G06F 1/1637 |
| | | 349/58 |
| 2012/0076573 A1 | 3/2012 | Pilliod et al. |
| 2012/0149437 A1* | 6/2012 | Zurek ................. H04M 1/0266 |
| | | 455/566 |
| 2013/0043054 A1 | 2/2013 | Ho |
| 2013/0065476 A1 | 3/2013 | Kim |
| 2015/0245513 A1* | 8/2015 | Moon ....................... G06F 1/20 |
| | | 361/679.01 |
| 2016/0174398 A1 | 6/2016 | Ido |
| 2016/0207236 A1 | 7/2016 | Tsubota et al. |
| 2016/0320658 A1* | 11/2016 | Reightler ............. G02B 6/0088 |
| 2017/0069956 A1 | 3/2017 | Hill et al. |
| 2017/0099742 A1* | 4/2017 | Choi ........................ H05K 5/03 |
| 2017/0196110 A1 | 7/2017 | Shinn |
| 2018/0011576 A1 | 1/2018 | Ryu |
| 2018/0017995 A1 | 1/2018 | Gable et al. |
| 2018/0033571 A1 | 2/2018 | Choi et al. |
| 2018/0081481 A1 | 3/2018 | Fournier et al. |
| 2018/0084680 A1* | 3/2018 | Jarvis ..................... H05K 1/144 |
| 2018/0088392 A1* | 3/2018 | Park ......................... B32B 7/06 |
| 2018/0103557 A1 | 4/2018 | Wright et al. |
| 2018/0199457 A1 | 7/2018 | Cheng |
| 2018/0284935 A1 | 10/2018 | Lee et al. |
| 2020/0020754 A1 | 1/2020 | Kim et al. |
| 2020/0271977 A1 | 8/2020 | Chen et al. |
| 2021/0405688 A1 | 12/2021 | Barrett et al. |

OTHER PUBLICATIONS

PCT International Search Report and Written Opinion for International Application No. PCT/US2019/061734, dated May 15, 2020 (34 pp.).

* cited by examiner

MOBILE DISPLAY ENCAPSULATION TO IMPROVE ROBUSTNESS AND WATER RESISTANCE

FIELD

The described embodiments relate generally to improved robustness and water resistance of electronic devices. More particularly, the present embodiments relate to filler materials that improves the robustness and water resistance of a mobile display.

BACKGROUND

In use, modern electronic devices are subject to a wide range of hazardous conditions such as forces from drop and fall events or stresses caused by compression. Further, electronic device can be subjected to physical contamination, corrosive chemicals, and/or water. These considerations can be particularly relevant to portable electronic and mobile device applications, where sensitive control and display components may be commonly exposed to stress events and undesirable environmental conditions.

A number of alternatives have been advanced to address these concerns, but these solutions typically involve bulky seals and isolation components that can drastically increase the size of a device and may negatively impact device performance and user experience. Accordingly, there remains a need for improved robustness of advanced consumer electronics and other digital device applications that do not undesirably increase the size of the device or impact performance. In particular, there is a need for increased impact protection and resistance to environmental exposure suitable for modern electronic devices.

SUMMARY

According to some aspects of the present disclosure, an electronic device includes a frame defining an aperture, a display component positioned in the aperture, and a filler material at least partially surrounding a periphery of the display component. The filler material can contact the display component and a portion of the frame defining the aperture.

In some examples, the filler material includes epoxy. A housing can at least partially define an internal volume with the frame being secured to the housing. The filler material can define a seal between an ambient environment and the internal volume. In some examples, a housing at least partially defines an internal volume, wherein the frame is secured to the housing and the filler material defines a tortuous leak path between an ambient environment and the internal volume. In some examples, a parylene coating can cover at least one of the display component or the filler material.

In some examples, the electronic device includes a housing that surrounds and is secured to the frame. The frame can define ports for injecting the filler material between the frame and the display component.

In some examples, the filler material is curable and has an uncured viscosity that is inversely proportional to a number and size of the ports. In some examples, the display component includes a bend region defined by a curved surface and the filler material can include a potting material that is positioned in the bend region in contact with the curved surface. The filler material can have a modulus of about 10 megapascals to about 20 megapascals.

According to some aspects, a display assembly includes a display layer, a contact component in electrical communication with the display layer, and a conformal coating at least partially covering the display layer and at least a portion of the contact component, the conformal coating defining an orifice positioned over a contact region of the contact component.

In some examples, the display assembly includes a protective material in contact with the display layer. The conformal coating at least partially covers the protective material. The conformal coating can have a thickness of about 2 microns to about 3 microns. The contact component can be a flex connector. In some examples, the display layer includes masked regions that prevent application on the conformal coating at the masked regions.

According to some aspects, a display assembly includes a frame including sidewalls that define ports and an aperture, a display component positioned in the aperture, the display component and the frame at least partially defining a volume, and a flowable filler material at least partially surrounding a periphery of the display component and positioned in the volume, the filler material contacting the display component and a sidewall.

In some examples, the filler material has a non-uniform thickness. The filler material can adhere the frame. The filler material can occupy substantially all of the volume. In some examples the filler material is non-reactive to moisture.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
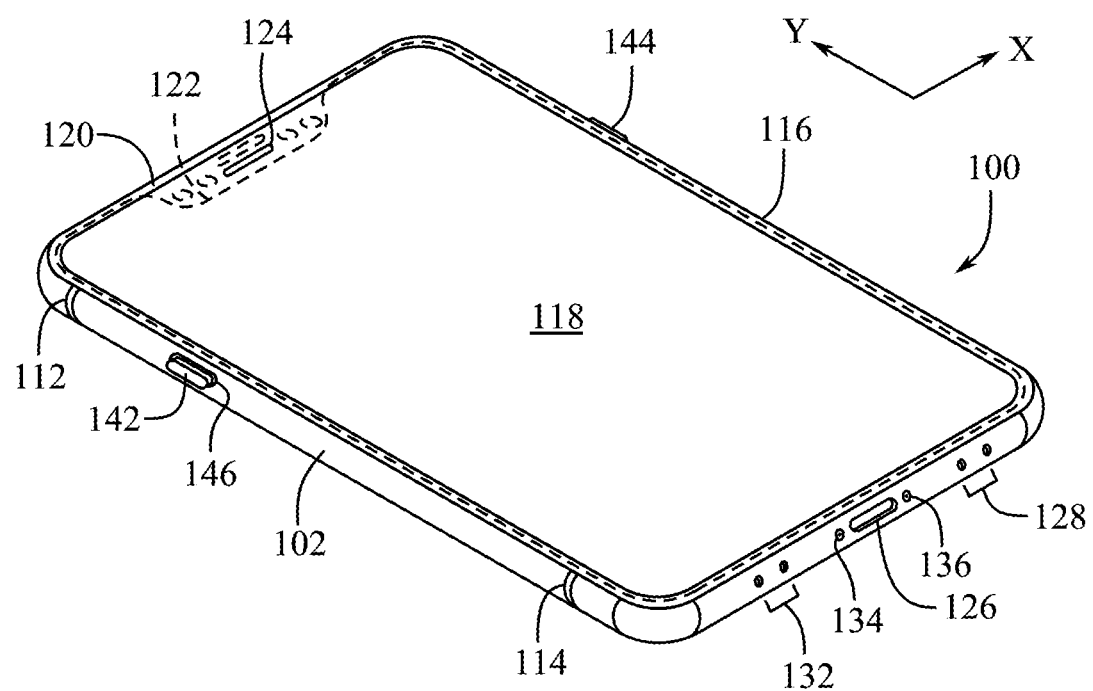
FIG. 1 shows a perspective view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to electronic devices with improved robustness and water resistance. The electronic devices described herein offer several enhancements over traditional devices. For example, traditional devices typically provide a "sway space" between the display components and a housing such that in the event of a drop or other high force event, the internal components would be allowed shift a certain amount before contacting and potentially becoming damaged by the housing. In contrast, electronic devices as described herein can include shock absorbing filler material that increases durability and improves sealing of display components within the electronic device.

The electronic devices described herein can be mobile wireless communication devices, such as a smartphones. In a particular example, an electronic device can include a housing that defines an aperture. In some examples, the housing includes a display frame defining an interior portion of the housing and a device enclosure defining an exterior portion of the housing. The display frame can be attached to internal electronic components of the electronic device, such as a display component. The device enclosure can surround and be secured to the display frame. In some examples, the display frame and/or device enclosure can be made from a composite of metal and plastic, such as steel and plastic.

A display component can be positioned in the aperture defined by the frame such that the housing borders or rings a periphery of the display component. In some examples, the display component can include a display panel or layer that includes a liquid crystal display ("LCD") that relies upon backlighting to present the visual information. In some examples, the display panel includes an organic light emitted diode ("OLED") display designed to illuminate individual pixels, when needed. In some examples, the display panel can be bent or folded to define a panel bend. The panel bend can be a concave curved surface or portion of the display panel.

In some examples, the display frame can define one or more ports for injecting a filler material between the housing and the display component after the display component has been coupled to the housing. The filler material can act as a shock absorbing material to improve the robustness of the electronic device and specifically to protect, isolate, and or reduce the exposure of the display layer and panel bend region from stress.

The filler material comprise one or more polymers, and in some examples can be a two-part epoxy. In some examples, the filler material can be a flowable or moldable material that behave like a soft rubber with a low level of shrinkage as it cures or solidifies. The filler material can have a modulus of about 10 megapascals to about 20 megapascals, or about 15 megapascals to about 20 megapascals. In some examples, the filler material has a viscosity that is inversely proportional to a number and size of the ports in the display frame. In some examples, the filler material has a non-uniform thickness. For instance, the thickness of the filler material can vary based on the width of the gap separating the frame and the display components.

The filler material can at least partially surround a periphery of the display component, such that the filler material is positioned between the display component and the housing and/or frame. In some examples, the filler material is in direct physical contact with the display component. In some examples, the filler material is in direct physical contact with the housing. In some examples, the filler material is in direct physical contact with the display component and the housing. For example, the filler material can abut or be positioned adjacent the panel bend, such that the filler material is sandwiched between an exterior convex region of the panel bend and the display frame. The filler material can occupy substantially all of the volume between the display component and the display frame. In this manner, the filler material occupies a volume of space traditionally used as a sway space. In some examples, the filler material can act as an adhesive to enhance coupling between the display component and housing. The filler material can adhere to at least one of metal, such as stainless steel, or polymers, such as nylon, acrylic, or pressure sensitive adhesive.

To further improve durability of the display component, a potting material can be positioned in the interior concave region of the panel bend. In some examples, the potting material can comprise a polymer and can be substantially similar to the filler material, however, the potting material can differ from the filler material. For example, the potting material can have a modulus of about 150 megapascals to about 300 megapascals. In this manner, the filler material and potting material can protect both sides on the panel bend region (e.g., an interior concave curve of the panel bend and an exterior convex curve of the panel bend).

In some examples, the filler material can serve as a sealing agent to protect internal components of the electronic device from exposure to water or moisture. For instance, the filler material can define an increased leak path that liquid would need to travel before reaching sensitive components. In some examples the filler material is non-reactive to moisture.

In some examples, a conformal coating can cover at least one of the display component or the filler material. In some examples, the conformal coating can act to supplement the filler material by sealing any gaps or cracks at interfaces between the filler material and the display component or housing. The conformal coating can include parylene-N with a thickness of about 2 microns to about 3 microns. The conformal coating can be applied to the electronic device by any deposition process as desired, for example by a vapor deposition process, such as a chemical vapor deposition (CVD). When applying the conformal coating masking can be applied to certain regions where the coating is not desired.

In some examples, a contact component, such as a flex connector, can be in electrical communication with the display layer, and the conformal coating can at least partially cover the display layer and at least a portion of the contact component. The conformal coating can define an orifice located at a contact region of the contact component to accommodate for the connection.

These and other embodiments are discussed below with reference to FIGS. 1-12. However, those skilled in the art will readily appreciate that the detailed description given herein with respect to these Figures is for explanatory purposes only and should not be construed as limiting.

FIG. 1 illustrates a perspective view of an embodiment of an electronic device 100. The electronic device 100 shown in FIG. 1 is a mobile wireless communication device, such as a smartphone. The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, a consumer device, or simply as a device.

The electronic device 100 can have a housing that includes a band 102 that defines an outer perimeter of the electronic device 100. The band 102, or portions thereof, can be formed using additive manufacturing processes or can be machined. In some examples, the frame 102 can define one or more sidewall components of the electronic device 100. In some examples, the frame 102 defines a non-continuous perimeter of the electronic device 100. That is, the frame 102 can be formed with gaps or spaces therein.

In some examples, the frame 102 includes an antenna assembly (not shown in FIG. 1). As a result, a non-metal material, or materials, can separate the sidewall components of the frame 102 from each other in order to electrically isolate the sidewall components. For example, separating materials 112, 114 can be position between sections of the frame 102. The aforementioned materials can include an electrically inert, or insulating, material(s), such as plastics and/or resin, as non-limiting examples. As discussed in greater detail below, the separating materials 112, 114 can be formed using similar manufacturing techniques as the frame 102. For instance, the separating materials 112, 114 can be formed using an additive manufacturing process.

The electronic device 100 can further include a display assembly 116 (shown as a dotted line) that is covered by a protective cover 118. The display assembly 116 can include multiple layers, with each layer providing a unique function. The display assembly 116 can be partially covered by a border 120 that extends along an outer edge of the protective cover 118 and partially covers an outer edge of the display assembly 116. In some examples, the border 120 can be a portion of the frame 102, being formed along with the frame 102. The border 120 can be positioned to hide or obscure any electrical and mechanical connections between the layers of the display assembly 116 and flexible circuit connectors. Also, the border 120 can exhibit a uniform thickness. For example, the border 120 can include a thickness that generally does not change in the X- and Y-dimensions.

Also, as shown in FIG. 1, the display assembly 116 can include a notch 122, representing an absence of the display assembly 116. The notch 122 can allow for a vision system that provides the electronic device 100 with information for object recognition, such as facial recognition. In this regard, the electronic device 100 can include a masking layer with openings (shown as dotted lines) designed to hide or obscure the vision system, while the openings allow the vision system to provide the object recognition information. Also, the protective cover 118 can be formed from a transparent material, such as glass, plastic, sapphire, or similar transparent materials. In this regard, the protective cover 118 can be referred to as a transparent cover, a transparent protective cover, or a cover glass (when the protective cover 118 includes glass). As shown in FIG. 1, the protective cover 118 can include an opening 124, which can represent a single opening of the protective cover 118. The opening 124 can allow for transmission of acoustical energy (in the form of audible sound) into the electronic device 100, which can be received by a microphone (not shown in FIG. 1) of the electronic device 100. Further, the opening 124 can allow for transmission of acoustical energy (in the form of audible sound) out of the electronic device 100, which can be generated by an audio module (not shown in FIG. 1) of the electronic device 100.

In some examples, the band 102 can define a port 126 designed to receive a connector of a cable assembly. The port 126 allows the electronic device 100 to communication data information (send and receive), and also allows the electronic device 100 to receive electrical energy to charge a battery assembly. Accordingly, the port 126 can include terminals that electrically couple to the connector. The port 126 can be formed as part of the additive manufacturing process to form the band 102 or can be formed by subsequent processing.

Furthermore, the band 102 can define several openings. For example, the band 102 can define openings 128 that allow an additional audio module (not shown in FIG. 1) of the electronic device to emit acoustical energy out of the electronic device 100. The band 102 can further define openings 132 that allow a microphone of the electronic device to receive acoustical energy. The band 102 can define holes to receive fasteners. For instance, the electronic device 100 can also include a first fastener 134 and a second fastener 136 designed to be fastened to a rail that is coupled to the protective cover 118. In this way, the first fastener 134 and the second fastener 136 can be designed to couple the protective cover 118 with the band 102. As discussed in greater detail below, the band 102 can define holes for injecting an encapsulant or filler material between the band 102 and the display assembly 116. These various openings can be formed as part of a 3D printing process in conjunction with formation of the band 102. In some examples, the openings are machined into the band 102 after the band 102 has been formed.

The electronic device 100 can include several control inputs designed to provide a command to the electronic device 100. For example, the electronic device 100 can include a first control input 142 and a second control input 144. The aforementioned control inputs can be used to adjust the visual information presented on the display assembly 116, and/or the volume of acoustical energy output by an audio module, as non-limiting examples. The controls can include one of a switch, a sensor, or a button designed to generate a command to a processor circuit. The control inputs can at least partially extend through openings in the sidewall components. For example, the second sidewall component 106 can include an opening 146 that receives the first control input 142. Further details of the electronic device 100 are provided below with reference to FIG. 2.

Figure 2:
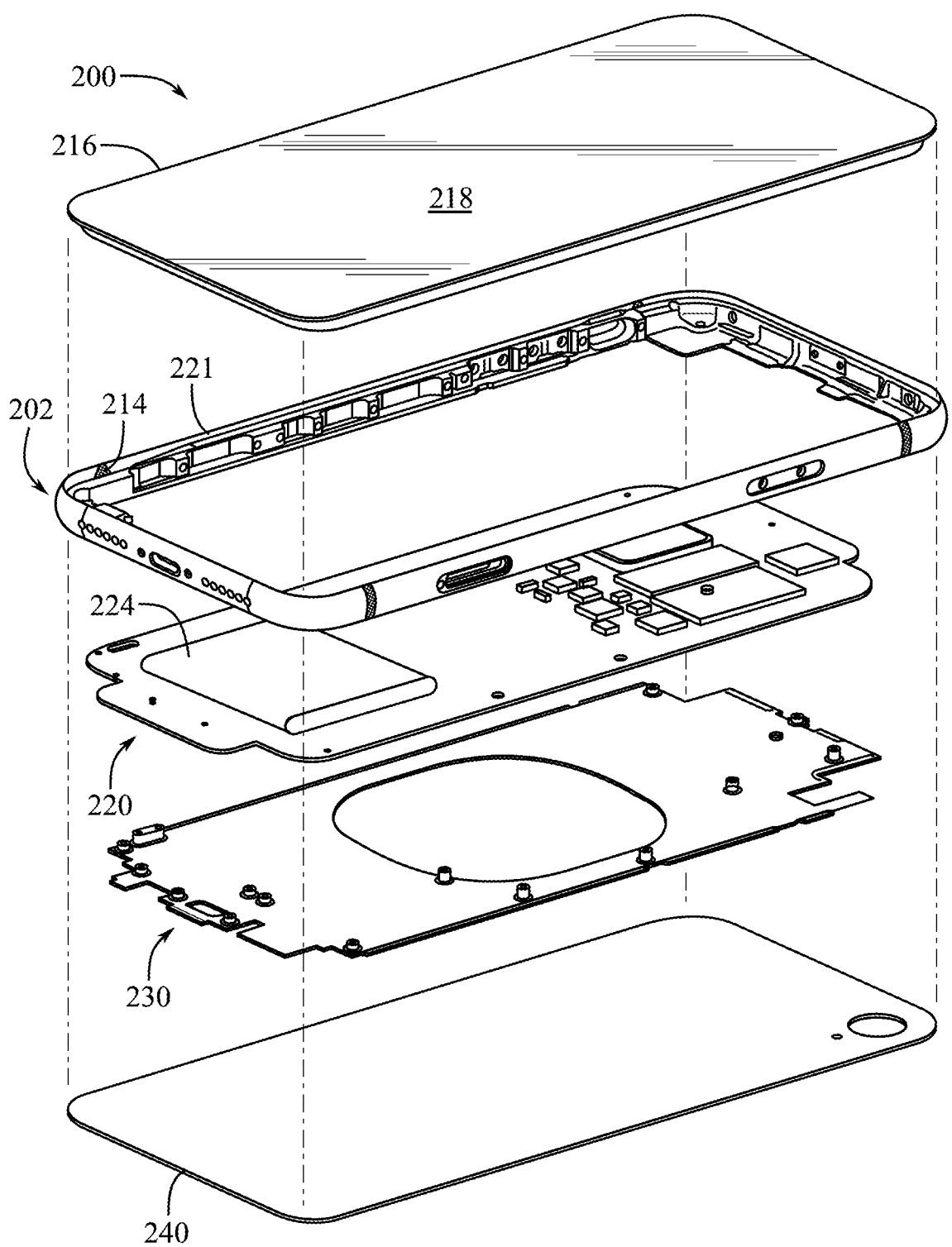
FIG. 2 shows an exploded perspective view of an electronic device.

FIG. 2 illustrates an exploded view of the electronic device 200. As shown, the band 202 at least partially defines an exterior portion, such as an outer perimeter of the electronic device. The band 202, can include one or more features to receive or couple to other components of the device 200, such as feature 221. For example, the band 202 can include any number of features such as apertures, cavities, indentations, bosses, protrusions, and other mating features configured to receive and/or attach to one or more components of the device 200. In some examples, the feature 221 can be printed onto the band 202 by an additive manufacturing process, as described herein. Further, in some examples, the feature 221 can include a metallic material different than the metallic material of the band 202. In some examples, both the band 202 and the feature 221 can be formed by one or more additive manufacturing processes. In some examples, as with the band 102, the band 202 can comprise multiple portions that can be electrically isolated from one another by a separating material 214.

The electronic device 200 can include a display assembly 216 that is covered by a protective cover 218. The display assembly 216 can include multiple layers, with each layer providing a unique function, and can include a frame (not shown) that can serve to fix, join, or attach the display assembly to the band 202 as described further herein.

The electronic device 200 can include internal components such as processors, memory, circuit boards, batteries, and sensors. Such components can be disposed within an internal volume defined, at least partially, by the band 202, and can be affixed to the band 202, via internal surfaces, attachment features such as feature 221, threaded connectors, studs, posts, and/or other fixing features, that are formed into, defined by, or otherwise part of the band 202.

The device 200 can include internal components, such as a system in package (SiP), including one or more integrated circuits such as a processors, sensors, and memory. The device 200 can also include a battery 224 housed in the internal volume of the device 200. The device 200 can also include one or more sensors, such as optical or other sensors, that can sense or otherwise detect information regarding the environment exterior to the internal volume of the device 200. Additional components, such as a haptic engine, can also be included in the device 200. In some examples, the display assembly 216 can be received by and/or attached to the band 202 by one or more attachment features.

The electronic device 200 can further include a chassis 220 that can provide structural support. The chassis 220 can include a rigid material, such as a metal, or can include a composite construction. The chassis 220 can also be coupled to the band 202. In this manner, the chassis 220 can provide an electrical grounding path for components electrically coupled to the chassis. The electronic device can alternatively or additionally include a back plate 230 having cladding layers and/or other attachment features such that one or more components of the electronic device 200 can be attached to the back plate 230, for example, via welding. The back plate 230 can form conductive pathways for connecting components of the electronic device 200. In some examples, the back plate 230 can be attached to the band 202 of the device 200 by one or more attachment features. In some examples, the band 202, the chassis 220, and the back plate 230 can be integrally formed with one another in any combination as a sectioned element by the additive manufacturing processes described herein.

An exterior surface of the electronic device 200 can further be defined by a back cover 240 that can be coupled with the band 202. In this regard, the back cover 240 can combine with the band 202 to form an enclosure or a housing of the electronic device 200, with the enclosure or housing (including band 202 and back cover 240) at least partially defining an internal volume. The back cover 240 can include a transparent material, such as glass, plastic, sapphire, or another transparent material. As discussed below, the back cover 240 can be formed together with the band 202 using an additive manufacturing process.

The housing, including the band 202, can be conformable to interior dimensional requirements, as defined by the internal components. For example, the structure of the housing including a band 202 can be defined or limited exclusively or primarily by the internal components the housing is designed to accommodate. That is, because a housing including a band 202 can be extremely light and strong, the housing can be shaped to house the interior components in a dimensionally efficient manner without being constrained by factors other than the dimensions of the components, such as the need for additional structural elements. In some examples, these formation processes discussed herein can allow for the housing and/or band 202 to have a detailed shape or design that is tailored specifically to satisfy one or more needs, such as internal dimensional requirements, without the need for additional features to reinforce the structure of the housing. Additionally, artifacts of the manufacturing process of the housing can be eliminated. Further details of the electronic devices are provided below with reference to FIG. 3.

Figure 3:
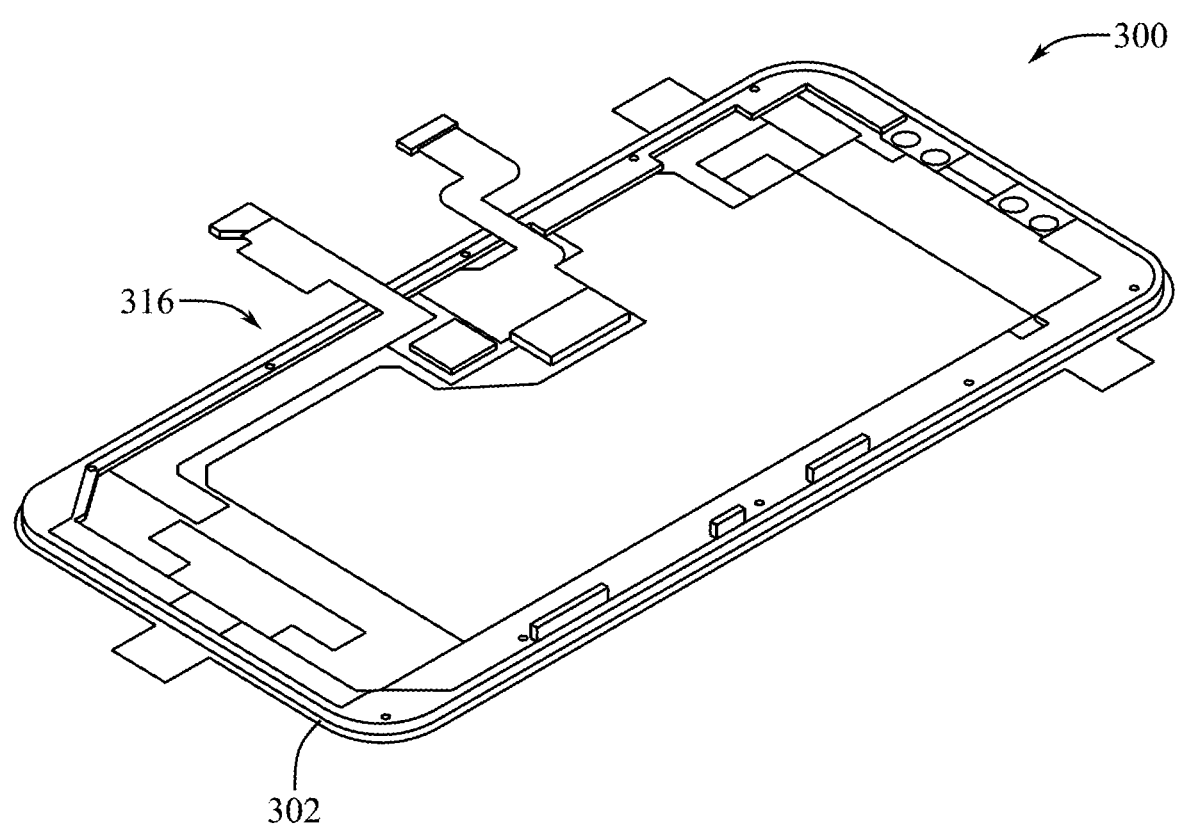
FIG. 3 shows an isolated perspective view of components of an electronic device.

FIG. 3 shows a perspective view of an electronic device 300 including a display assembly 316 positioned in a frame 302. The electronic device 300 can be substantially similar to, and include some or all of the features of any of the electronic devices discussed herein, such as electronic devices 100 and 200. Various components of the electronic device 300 have been removed for clarity. In some examples, the display assembly 316 can be attached to the frame 302 by various attachment means, such as adhesion, welding, or mechanical attachment. In some examples, the frame 302 be made from a composite of steel and plastic. The frame 302 can act as an interface between the display assembly 316 and an outer shell, housing, or band (not shown in FIG. 3). In this manner, the frame 302 can act as a protective barrier to the periphery of the display assembly 316.

Any number or variety of components in any of the configurations described herein can be included in the input device. The components can include any combination of the features described herein and can be arranged in any of the various configurations described herein. The structure and arrangement of components of an input device having a housing with structures described herein, and defining an internal volume, as well as the concepts regarding input components, filler materials, and display assemblies, can apply not only to the specific examples discussed herein, but to any number of examples in any combination. Various examples of electronic devices including components having various features in various arrangements are described below, with reference to FIGS. 4-6.

Figure 4:
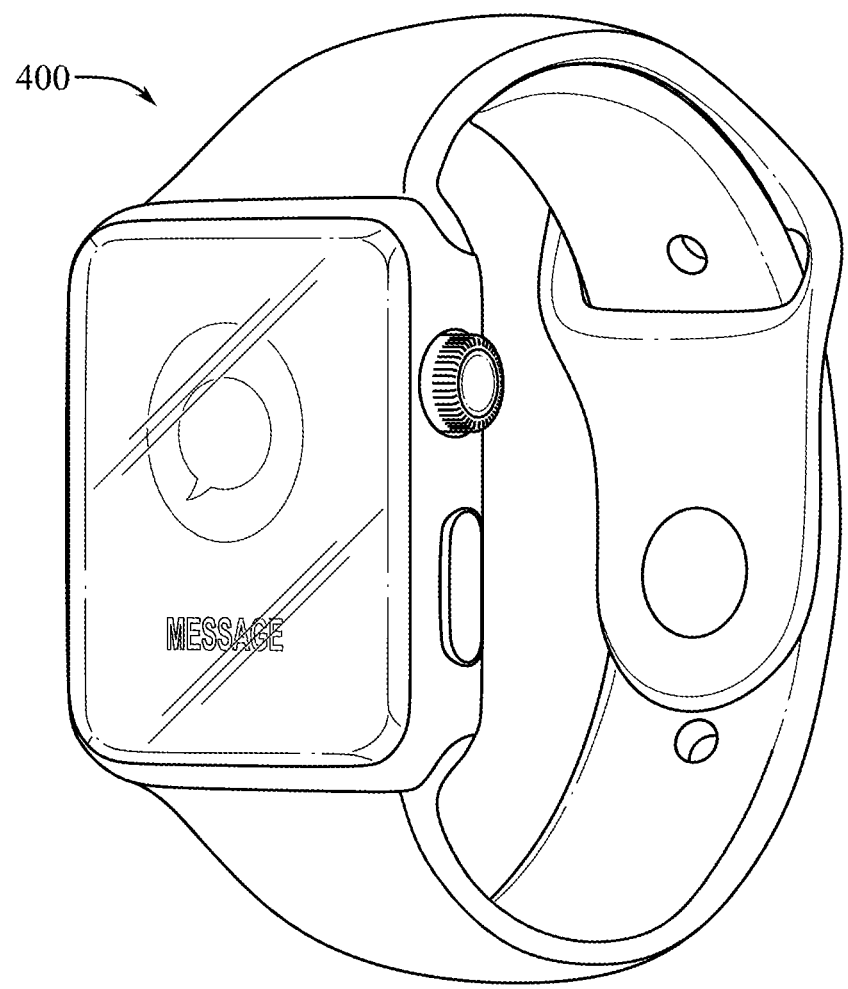
FIG. 4 shows a perspective view of an electronic device.

FIG. 4 shows another example of an electronic device 400. The electronic device shown in FIG. 4 is a watch, such as a smartwatch. The smartwatch 400 of FIG. 4 is merely one representative example of a device that can be used in conjunction with the components and methods disclosed herein. As described with respect to electronic device 100, electronic device 400 can correspond to any form of wearable electronic device, a portable media player, a media storage device, a portable digital assistant ("PDA"), a tablet computer, a computer, a mobile communication device, a GPS unit, a remote control device, and other devices. The electronic device 400 can be referred to as an electronic device, or a consumer device. Further details of a watch are provided below with reference to FIG. 5.

Figure 5:
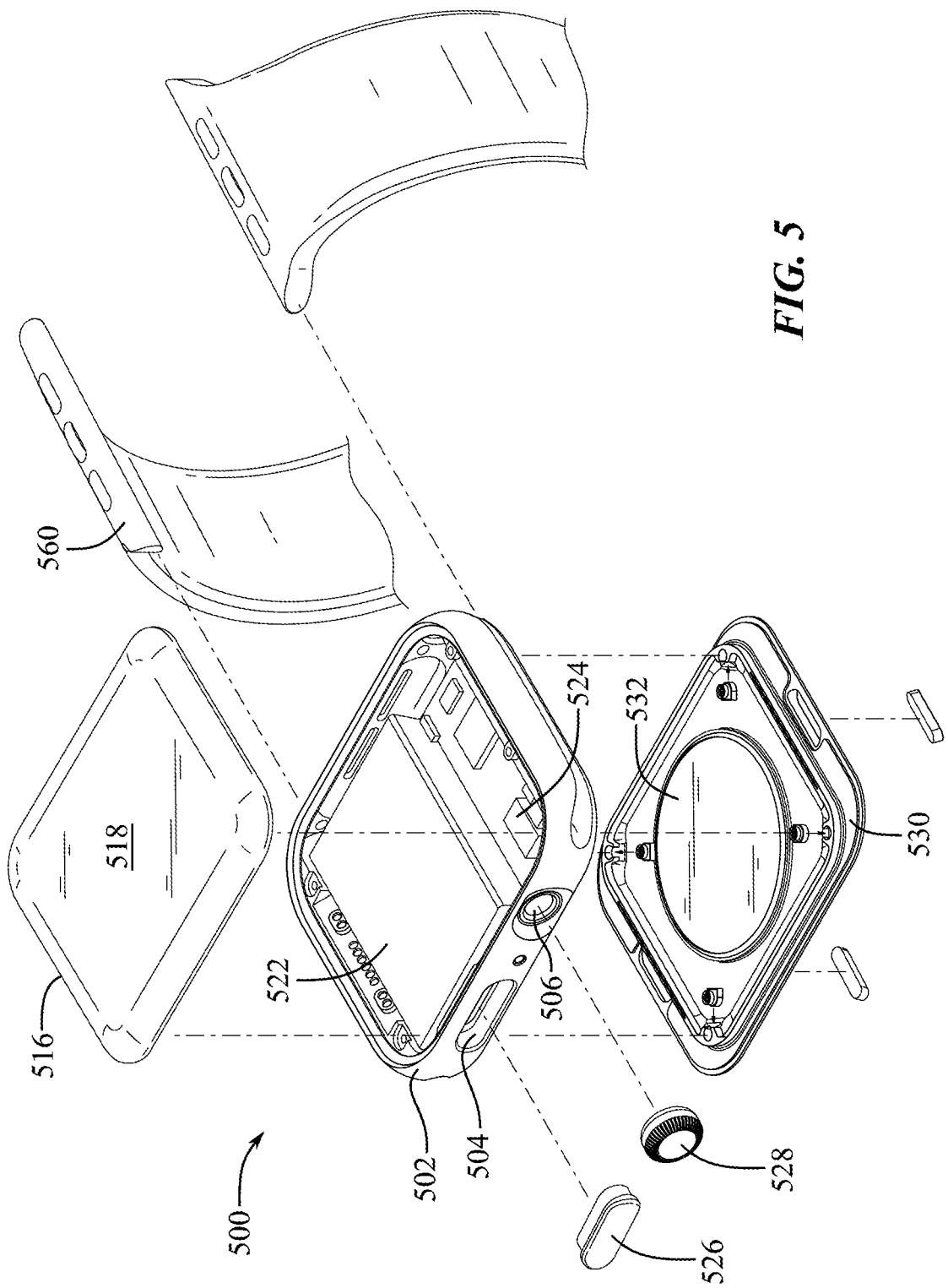
FIG. 5 shows an exploded view of an electronic device.

Referring now to FIG. 5, the electronic device 500 can include a housing 502, and a cover 518 attached to the housing. The housing 502 can substantially define at least a portion of an exterior surface of the device 500. The cover 518 can include glass, plastic, or any other substantially transparent material, component, or assembly. Although in some examples, the cover 518 can comprise a material or materials that are not transparent. The cover 518 can cover or otherwise overlay a display assembly 516. The display assembly 516 can include multiple layers, with each layer providing a unique function. Accordingly, the cover 518 can be, or be a part of, an interface component. The cover 518 can define a front exterior surface of the device 500 and, as described herein, this exterior surface can be considered an interface surface. In some examples, the interface surface defined by the cover 518 can receive inputs, such as touch inputs, from a user.

A back cover 530 can also be attached to the housing 502, for example opposite the cover 518. The back cover 530 can include ceramic, plastic, metal, or combinations thereof. In some examples, the back cover 530 can include an electromagnetically transparent portion 532. The electromagnetically transparent portion 532 can be transparent to any desired wavelengths of electromagnetic radiation, such as visible light, infrared light, radio waves, or combinations thereof. Together, the housing 502, cover 518 and back cover 530 can substantially define an internal volume and external surface of the device 500.

The housing 502 can be a substantially continuous or unitary component and can include one or more openings 504, 506 to receive components of the electronic device 500 and/or provide access to an internal portion of the electronic device 500. In some examples, the device 500 can include input components such as one or more buttons 526 and/or a crown 528 that can be disposed in the openings 504, 506. In some examples, a material can be disposed between the buttons 526 and/or crown 528 and the housing 502 to provide an airtight and/or watertight seal at the locations of the openings 504, 506. As discussed in greater detail below, the housing 502 can define holes for injecting an encapsulant or filler material between the housing 502 and the display assembly 516.

The electronic device 500 can further include a strap 560, or other component designed to attach the device 500 to a user, or to provide wearable functionality. In some examples, the strap 560 can be a flexible material that can comfortably allow the device 500 to be retained on a user's body at a desired location. Further, the housing 502 can include a feature or features that can provide attachment locations for the strap 560. In some examples, the strap 560 can be retained on the housing 502 by any desired techniques. For example, the strap 560 can include any combination of magnets that are attracted to magnets disposed within the housing 502, and/or retention components that mechanically retain the strap 560 against the housing 502.

The device 500 can also include internal components, such as a haptic engine 524, a battery 522, and a system in package (SiP), including one or more integrated circuits, such as processors, sensors, and memory. The SiP can also include a package. The internal components, such as one or more of components 522, 524 can be disposed within the internal volume defined at least partially by the housing 502, and can be affixed to the housing 502 via internal surfaces, attachment features, threaded connectors, studs, posts, or other features, that are formed into, defined by, or otherwise part of the housing 502 and/or the cover 518 and/or back cover 530.

Figure 6:
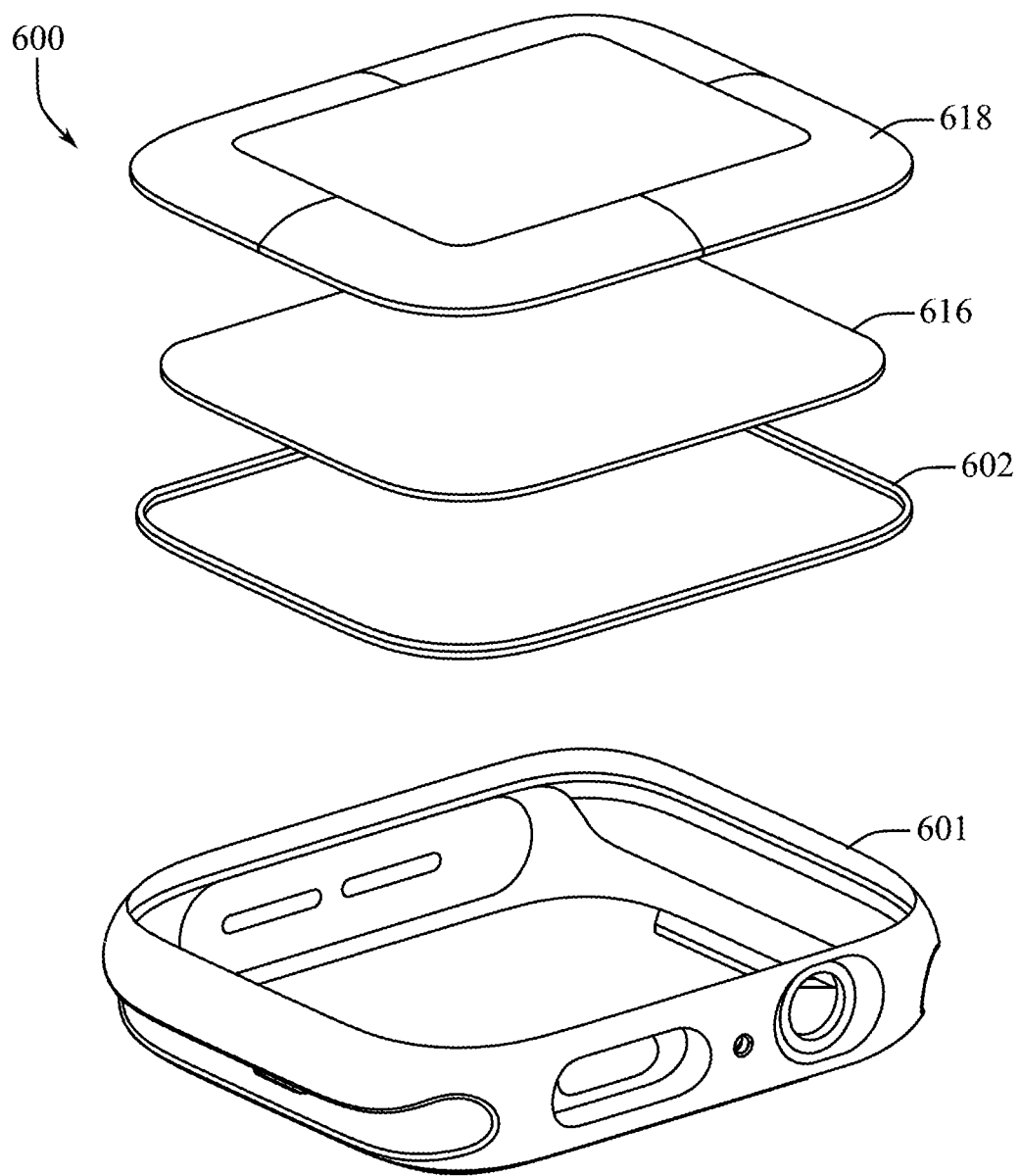
FIG. 6 shows an isolated perspective view of components of an electronic device.

FIG. 6 shows an exploded view of an electronic device 600 including a display assembly 616, a cover 618, a frame 602, and a housing 601. The electronic device 600 can be substantially similar to, and include some or all of the features of any of the electronic devices discussed herein, such as electronic devices 100, 200, 300, 400, and 500. Various components of the electronic device 300 have been removed for clarity. In some examples, the display assembly 616 can be attached to the frame 602 by various attachment means, such as adhesion, welding, or mechanical attachment. In some examples, the frame 602 be made from a composite of steel and plastic. The frame 602 can act as an interface between the display assembly 616 and an outer shell or housing 601. In this manner, the frame 602 can act as a protective barrier to the periphery of the display assembly 616.

Any number or variety of components in any of the configurations described herein can be included in the input device. The components can include any combination of the features described herein and can be arranged in any of the various configurations described herein. The structure and arrangement of components of an input device having a housing with structures described herein, and defining an internal volume, as well as the concepts regarding input components, filler materials, and display assemblies, can apply not only to the specific examples discussed herein, but to any number of examples in any combination. Various examples of electronic devices including components having various features in various arrangements are described below, with reference to FIGS. 7-8B.

Figure 7:
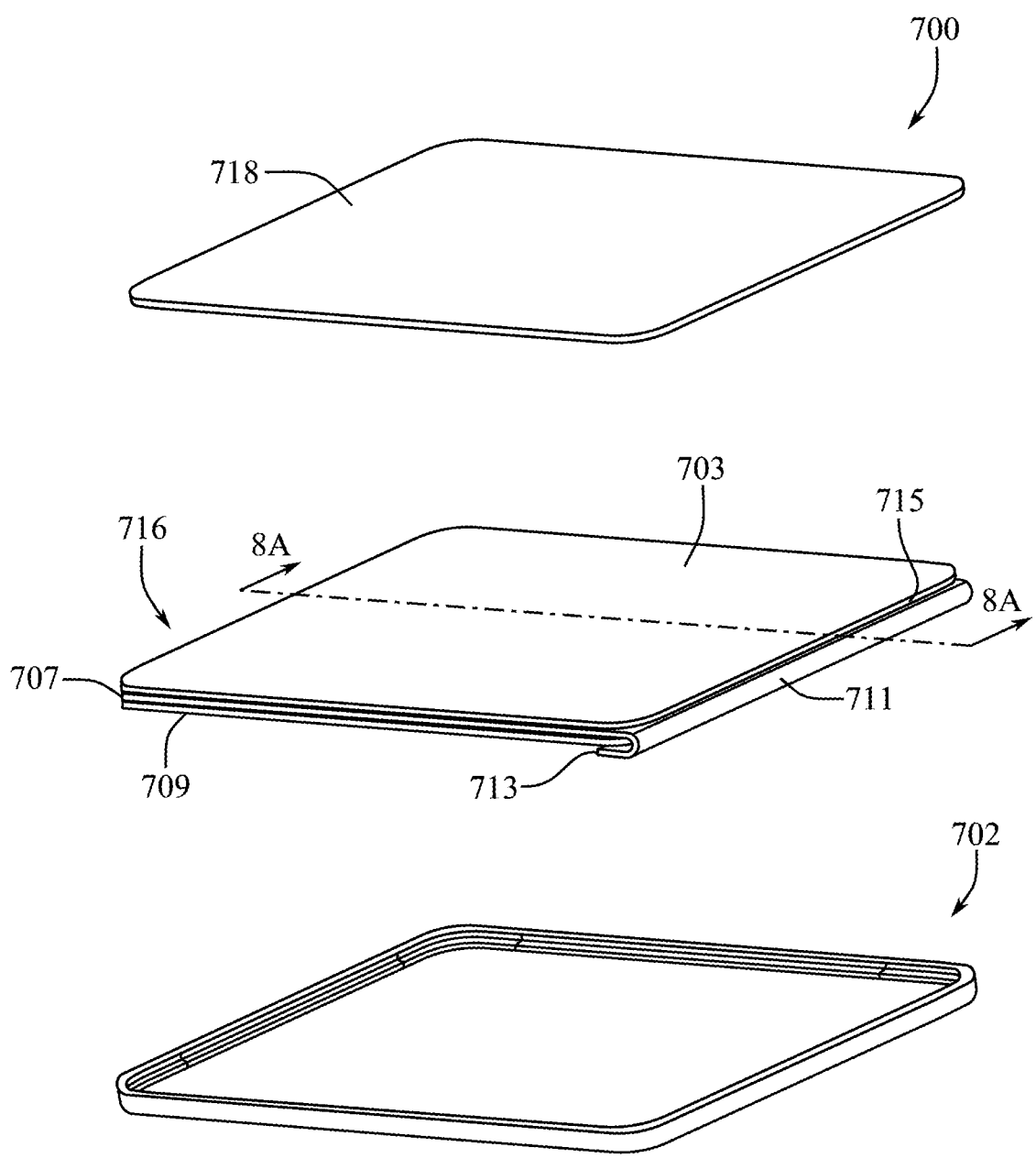
FIG. 7 shows an exploded perspective view of components of an electronic device.

FIG. 7 illustrates a partial exploded view of an electronic device 700. The electronic device 700 can be substantially similar to, and include some or all of the features of the electronic devices discussed herein, such as electronic devices 100-300. Several features of the electronic device 700 are not shown for simplicity. A first protective layer 718, such as a cover glass, can overlay a display assembly 716. The first protective layer 718 can be adhesively secured to the display assembly 716 with an adhesive layer (not shown) or by any other technique as desired.

The display assembly 716 can include a touch sensitive layer 703 designed to receive a touch input, a display layer 707 designed to present visual information, and a force sensitive layer 709 designed to detect an amount of force applied to, or exerted on, the display layer 707 by way a force applied to at least one of the first protective layer 718, the touch sensitive layer 703, and the display layer 707. Although not shown, the display assembly 716 can include adhesive layers to adhesively secure the touch sensitive layer 703 with the display layer 707, and to adhesively secure the display layer 707 with the force sensitive layer 709.

The touch sensitive layer 703 is designed to receive a touch input when, for example, a user can exert pressure the first protective layer 718. The touch sensitive layer 703 can include capacitive touch-sensitive technology. For example, the touch sensitive layer 703 can include a layer of capacitive material that holds an electrical charge. The layer of capacitive material is designed to form a part of multiple capacitive parallel plates throughout a location corresponding to the display layer 707. In this regard, when a user touches the first protective layer 718, the user forms one or more capacitors. Moreover, the user causes a volt drop across the one or more capacitors, which in turns causes the electrical charge of the capacitive material to change at a specific point (or points) of contact corresponding to a location of the user's touch input. The capacitance change and/or voltage drop can be measured by the electronic device 700 to determine the location of the touch input. The touch sensitive layer 703 can include an edge region 715. The edge region 715 can include electrical connectors.

In some examples, the display layer 707 includes a liquid crystal display ("LCD") that relies upon backlighting to present the visual information. In the embodiment shown in FIG. 7, the display layer 707 includes a light emitting diode (LED) and/or organic light emitted diode ("OLED") display designed to illuminate individual pixels, when needed. When the display layer 707 includes OLED technology, the display layer 707 can include a reduced form factor as compared to that of an LCD display. In this regard, the display assembly 716 can include a smaller footprint and/or thickness, thereby creating more space for other components in the internal volume, such as a battery assembly. In some examples, the display layer 707 can be curved or bent without causing damage to the display layer 707. For example, as shown in FIG. 7, the display layer 707 includes or defines a bend or bend region 711. The bend region 711 can be a 180-degree bend, or approximately a 180-degree bend. In some examples, the bend 711 can be at any angle and/or radius of curvature as desired and can be at least about a 90-degree bend, at least about a 120-degree bend, at least about a 135-degree bend, at least about a 150-degree bend, at least about a 180-degree bend, at least about a 220-degree bend, at least about a 235 degree bend, or at least about a 270-degree bend or more. In some examples, the bend 711 allows the display layer 707 to bend or curve around at least a portion of the force sensitive layer 709, as shown in FIG. 7. In some examples, the bend 711 can extend along a length or width of the electronic device. In some examples, the display layer 707 comprises multiple bends 711 on various edges of the display layer 707. For example, the display layer 707 can define two bends on opposing ends of the display layer 707 that run along substantially all of a length of the electronic device 700.

The display layer 707 can include an edge region or tail portion 713 that includes a connector (not shown) used to electrically and mechanically couple the display layer 707 with a flexible circuit (not shown) that electrically couples with a circuit board assembly (shown below), with flexible circuit placing the display layer 707 in communication with the circuit board assembly. In some examples, the display layer 707 can include an active matrix organic light emitting diode ("AMOLED") display. The edge region 715 of the touch sensitive layer 703 can be parallel, or at least substantially parallel, with respect to the edge region or tail portion 713 of the display layer 707, even when the display layer 707 includes the bend 711.

The force sensitive layer 709 can operate by determining an amount of force or pressure applied to the first protective layer 718, the touch sensitive layer 703, and/or the display layer 707. In this regard, the force sensitive layer 709 can distinguish between different amounts of force applied to the electronic device 100. The different amounts of force can correspond to different user inputs. The force sensitive layer 709 can include multiple parallel capacitor plate arrangements, with one plate of each capacitor plate arrangement having an electrical charge. When a force to the first protective layer 718 causes the distance between one or more pairs of parallel plate capacitor to reduce, a change in capacitance between the one or more pairs of parallel plate capacitor can occur. The amount of change in capacitance corresponds to an amount of force exerted on the first protective layer 718.

Further, in order to support the first protective layer 718 and the display assembly 716 and facilitate assembly of the first protective layer 718 and the display assembly 716 with the electronic device 700 can include a frame 702 that receives and secures with the first protective layer 718 and display assembly 716. Accordingly, the frame 702 can include a size and shape in accordance with that of the first protective layer 718 and/or the display assembly 716. In some examples, the frame 702 can at least partially define an exterior surface of the electronic device 700. In some examples the electronic device 700 further includes a band or housing (not shown in FIG. 7) that defines an exterior shell or surface of the electronic device 700 and couples to the frame 702. The frame 702 can be formed from a polymeric material, such as plastic, and can also include a metal ring (not shown) that is partially embedded in the polymeric material during an insert molding operation. In this regard, the frame 702 can structurally support the first protective layer 718, as well as one or more components of the display assembly 716. This will be shown below in greater detail below with further details of a display assembly being provided below with reference to FIG. 8A.

Figure 8A:
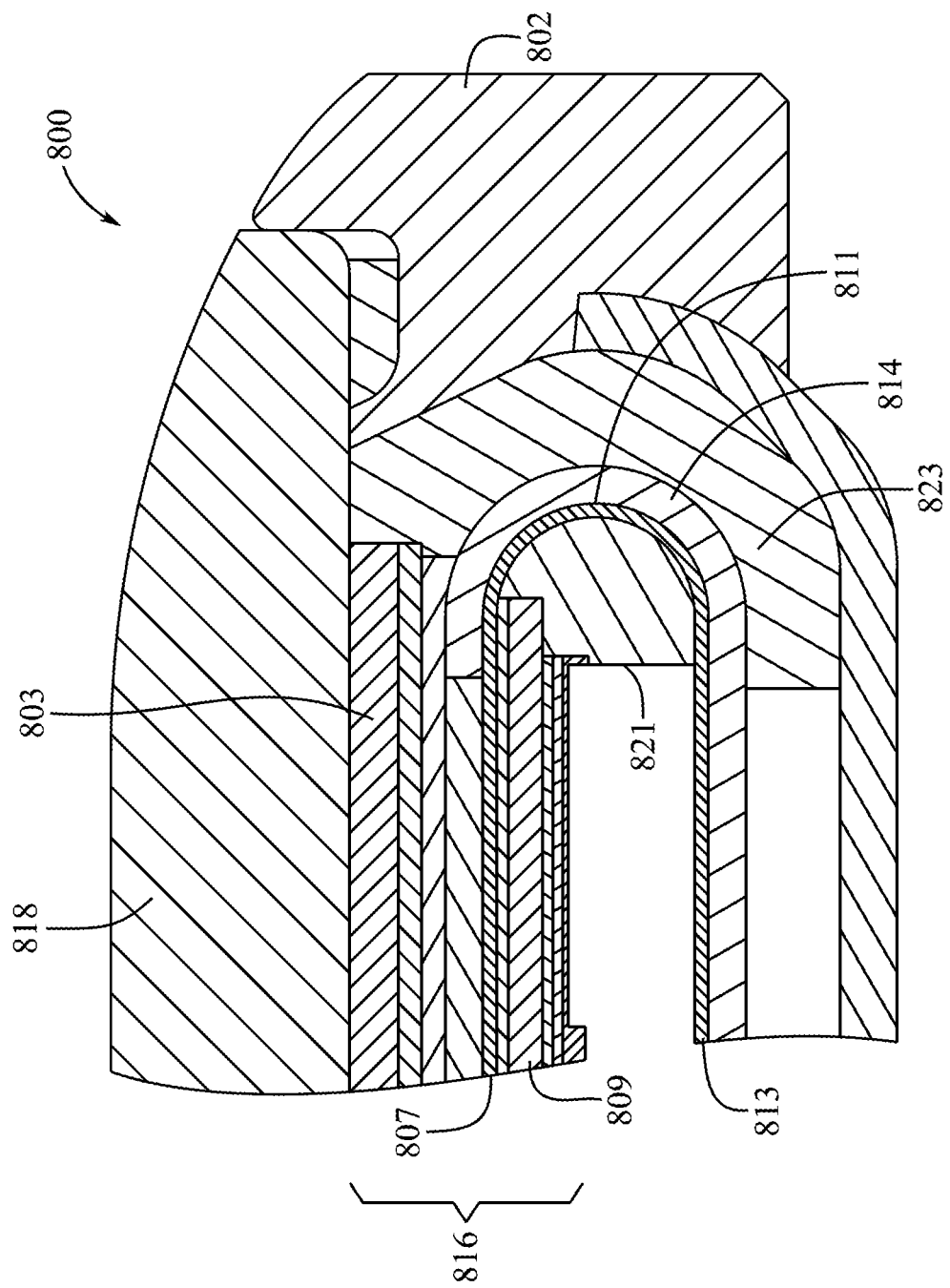
FIG. 8A shows a side cross-sectional view of components of an electronic device.

FIG. 8A illustrates a side cross-sectional view of an electronic device 800. The electronic device 800 can be substantially similar to, and include some or all of the features of any of the electronic devices discussed herein, such as electronic devices 100-700. In some examples, the electronic device 800 includes a frame 802 that at least partially surrounds a display assembly 816.

Similar to other examples described herein, the electronic device 800 may include a display assembly 816 that includes a touch sensitive layer 803 designed to receive a touch input, a display layer 807 designed to present visual information, and a force sensitive layer 809 designed to detect an amount of force applied to, or exerted on, the display layer 807 by way a force applied to at least one of the touch sensitive layer 803, the display layer 807, and a protective cover 818 that overlays the display assembly 816. In some examples, the display assembly 816 may further include a rigid plate to provide structural support and stiffness to the display assembly 816.

The display layer 807 can extend beyond the force sensitive layer 809 and define a bend 811 that connects to a tail portion 813. The electronic device 800 can further include a first material 821 covering a surface of the display layer 807. The first material 821 can include a potting material that supports the display layer 807. Specifically, the first material 821 can reinforce or bolster the bend 811 of the display layer 807, against external forces or stresses. In order to supply the first material 821, a needle (not shown in FIG. 8A8) can be inserted into a location within the bend region of the display layer 807. The needle or other deposition component can disperse the material while being pulled out of the electronic device 800. In some examples, the first material 823 is deposited prior to the display layer 807 being bent.

The potting material 821 can have a modulus of about 180 megapascals to about 300 megapascals, or of about 200 megapascals to about 280 megapascals. In some examples, the display assembly 816 includes a strain-neutralization layer 814 on an exterior of the bend 811, such that the bend 811 is positioned between the strain-neutralization layer 814 and the potting material 821. In some examples, the strain-neutralization layer 814 covers a region of the tail portion 813 and/or some of the display panel 807 before the bend 811.

In some examples, the potting material 821 is pre-cured, such as with exposure to ultra-violet (UV) light. For examples, the potting material 821 can be applied to the display layer 807 before it is bent. The potting material 821 can then be pre-cured using (UV) light to partially solidify the potting material 821 and to increase the adhesion of the potting material 821 to the display layer 807.

In some examples, the potting material 821 can undergo a final moisture curing phase. The potting material 821 can be moisture cured after the display layer 807 is bent, resulting in the potting material 821 being positioned in the bend 811. In some examples, a gap exists adjacent the potting material 821 to allow for moisture to cure the potting material 821. In some examples, the potting material 821 can be formulated to adhere to polyimide. The potting material 821 can be configured to adhere to at least stainless steel, glass-filled nylon, acrylic, and pressure sensitive adhesives. In some examples, any other curing or hardening techniques can be used as desired.

The display layer 807 can further include a second material or filler material 823 covering a surface of the display layer 807. The second material 823 can provide a compression force to metal traces in the display layer 807, and prevent tension forces from acting on the metal traces, thereby preventing damage to the display layer. The second material 823 can provide stiffness and structural support to the display layer 807. The filler material 823 can be positioned between the bend 811 and the frame 802. The filler material 823 can be deposited along an entirety of the bend 811. In some examples, the filler material 823 is positioned around substantially all of the perimeter of the frame 802 and display assembly 816.

Thus, in contrast to conventional techniques, the disclosed electronic device 800 includes a filler material 823 positioned in the volume that would generally be empty or used as a sway space. In some examples, no air gaps are permitted between the display assembly 816 and the frame, without the filler material 823 being positioned in the air gap. In some examples, the filler material 823 inhibits sway or movement of the display assembly 816 relative to the frame 802. In this manner, the described electronic device 800 has improved durability over conventional devices.

The second or filler material 823 can be a two-part epoxy that is designed to behave like a soft rubber with low levels of shrinkage. In some examples, the filler material 823 can include a relatively low modulus so as to not transmit load to the display assembly 816. For example, the filler material 823 can have a modulus of about 18 megapascals to about 28 megapascals, or about 17 megapascals to about 22 megapascals. In some examples, the filler material 823 has a modulus of about 20 megapascals. In this manner, the filler material 823 can act as shock absorbers. The filler material 823 can be hard enough to allow curing and avoid decreasing display reliability. In some examples, the filler material 823 can be formulated to adhere to the materials of the display assembly 816, such as polyimide when the display assembly 816 comprises polyimide. The filler material 823 can be configured to adhere to at least stainless steel, glass-filled nylon, acrylic, and pressure sensitive adhesives. The filler material 823 can be formulated to not react with moisture. In some examples, the first and second materials 821, 823 can be the same material.

In some examples, the filler material 823 has a non-uniform thickness. For instance, the thickness of the filler material 823 can vary based on the width of the gap separating the frame 802 and the display assembly 816. The amount and thickness of the filler material 823 can vary depending on the need and space proximate internal components of the electronic device 800. In some examples, the smallest gap between the display layer 807 and the frame 802 is the space between the edge of the bend 811 and the corners of the frame 802. Thus, this location can also be the smallest filler material thickness along the frame 802. In some examples, the minimum bead width of the filler material 823 is about 0.3 millimeters to about 0.4 millimeters. In some examples, the average bead width of the filler material 823 is about 0.6 millimeters.

In some examples, in addition to acting as a support or reinforcing buffer, the second material 823 can act as an additional adhesive in coupling the display assembly 816, cover glass 818, and frame 802. In some examples, the second material 823 is the primary coupling mechanism between at least two of the display assembly 816, cover glass 818, frame 802, and back plate.

An additional advantage is that traditional methyl methacrylate adhesives may evaporate when exposed to air, which can create a low strength adhesive, however, by adding the filler material 823, the evaporation of methyl methacrylate adhesives, for example as used in the display assembly 816, is prevented. Further details of filler materials are provided below with reference to FIG. 8B.

Figure 8B:
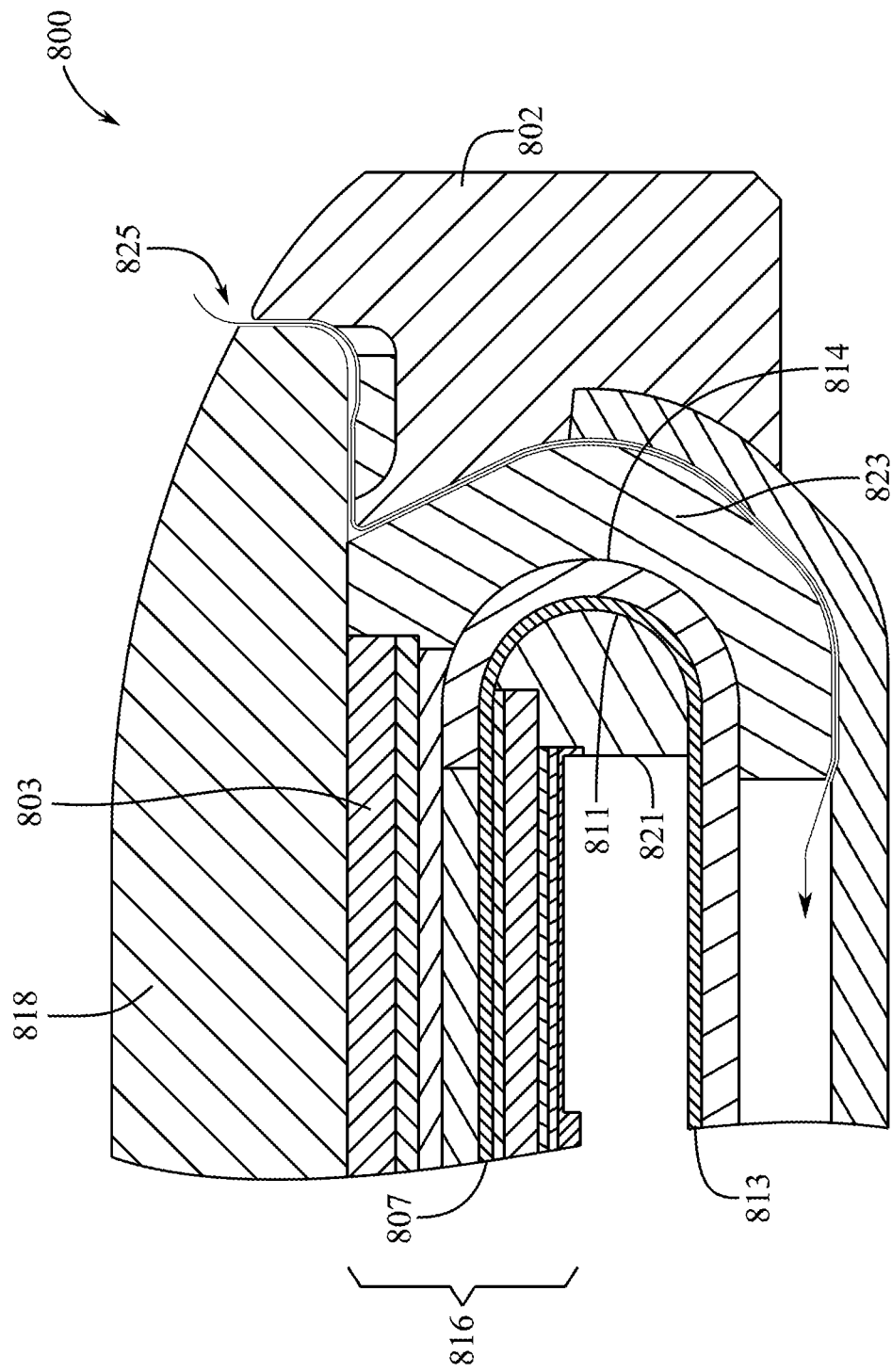
FIG. 8B shows a side cross-sectional view of internal components of an electronic device.

As can be seen in FIG. 8B, in some examples, the filler material 823 can improve water-resistance capabilities by acting as a seal and providing an increased leak path 628 between the ambient environment and the display assembly 816. In some examples, the filler material 823 can define a longer, more tortuous leak path that moisture would need to travel before reaching sensitive electronic components, thereby reducing the likelihood of water or moisture ingress into the internal volume of the device, and specifically to the display assembly 816. In this manner, the filler material 823 can simultaneously provide more structural integrity and increased water resistance to the internal components of the electronic device 800.

Any number or variety of components in any of the configurations described herein can be included in the input device. The components can include any combination of the features described herein and can be arranged in any of the various configurations described herein. The structure and arrangement of components of an input device having a housing with structures described herein, and defining an internal volume, as well as the concepts regarding input components, filler materials, and display assemblies, can apply not only to the specific examples discussed herein, but to any number of examples in any combination. Various examples of electronic devices including components having various features in various arrangements are described below, with reference to FIGS. 9-11B.

Figure 9:
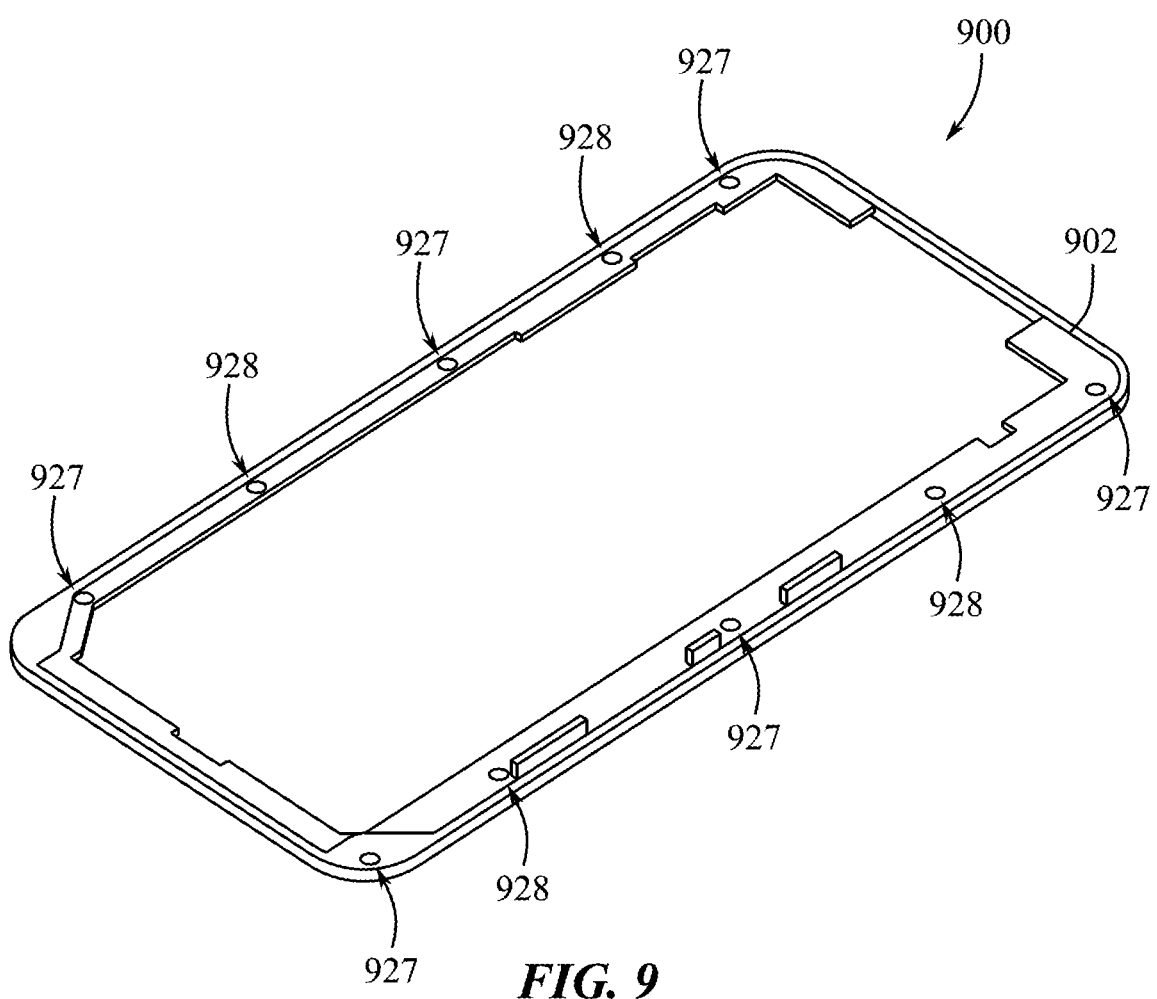
FIG. 9 shows a perspective view of a frame of an electronic device.

FIG. 9 illustrates a frame 902. The frame 902 can be substantially similar to, and include some or all of the features of any of the frames discussed herein, such as electronic devices 100-800. In some examples, the frame 902 can define injection holes or ports 927 and air vents 928. The ports 927 and/or vents 928 can be machined into the frame 902 or can be molded into the frame 902 concurrently with formation of the frame 902. The ports 927 can be configured to receive an encapsulant material (not shown in FIG. 9), such as the filler material 523 and/or potting material 521 discussed herein. In some examples, the ports 927 and vents 928 have a diameter of about 0.5 to about 2 millimeters. In some examples, the ports 927 and vents 928 have a diameter of about 1 millimeter. The diameter of any given port 927 or vent 928 can vary depending on its location. The number and location of ports can be determined based on the geometry of the frame 902 and the position of the internal components relative to the frame 902. In some examples, the number, location, and size of the ports 927 can be based on characteristics of the encapsulant material. For instance, a filler that has a low viscosity may require fewer or smaller ports 927 because the filler is able to more freely flow between the frame 902 and the internal components of the electronic device. On the other hand, a filler that is has a high viscosity may require more ports 927 with larger apertures to allow the highly viscous filler to reach the desired locations. In some examples, the viscosity of the epoxy or filler is sufficiently low to flow between the display panel bend.

In some examples, as the filler is injected into the desired locations, there is a need to allow the displaced air to escape or vent. Accordingly, in some examples, the vents 928 can be configured to allow air or gas to vent into the environment. The vents 928 can be positioned at preselected locations to optimize the venting process. In some examples, the number and location of vents 928 is proportional to the number and location of ports 927. In some examples, the number, location, and size of vents depends on the injection procedure, for instance, how quickly the filler is injected. In some examples, filler material is deposited directly on a surface of the frame 902 before the display assembly 716 is coupled to the frame 902. In this manner no ports 927 are needed because the filler material was deposited on the frame 902 before coupling with the display assembly 716.

Figure 10:
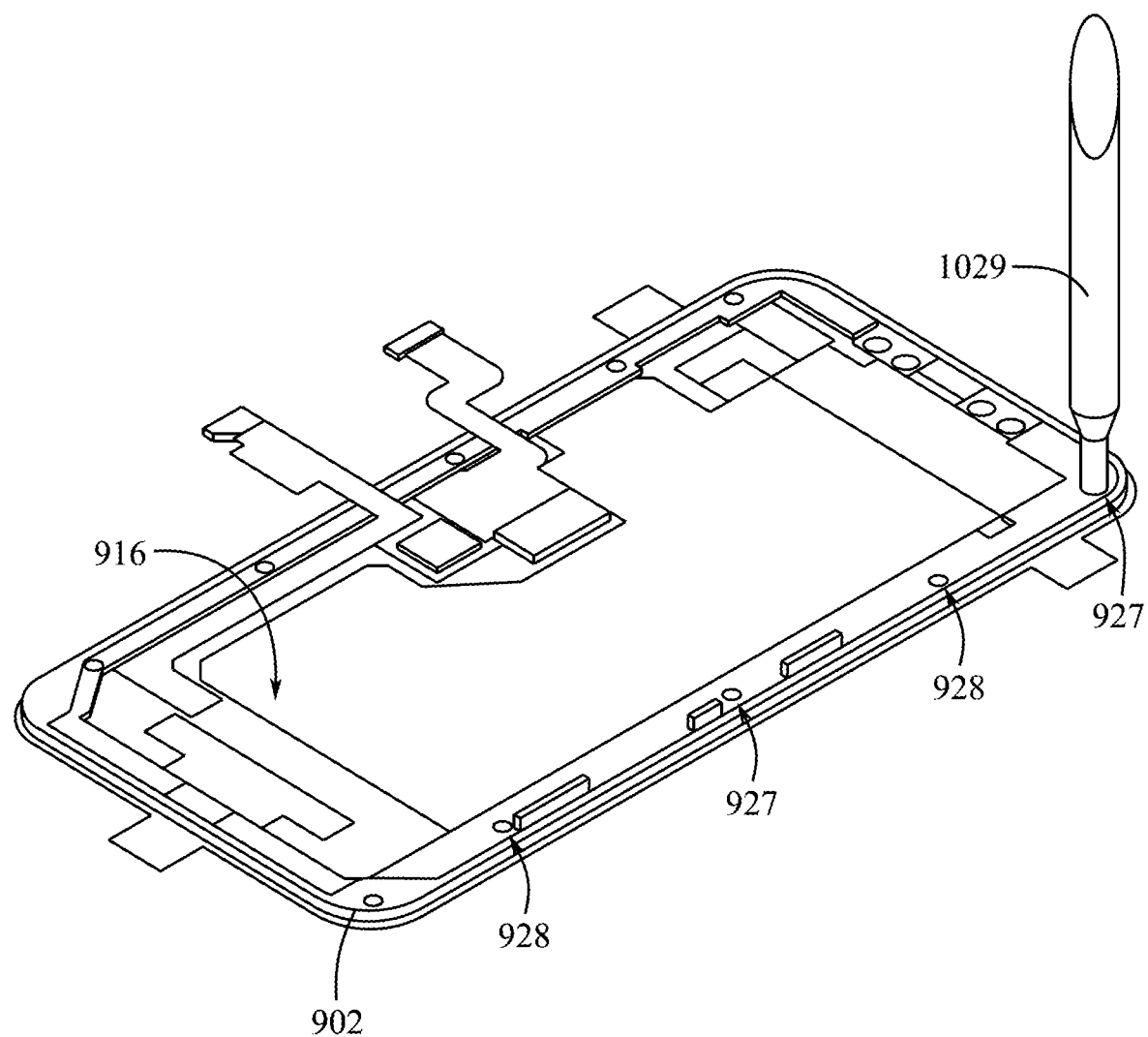
FIG. 10 shows a perspective view of a material being deposited on an electronic device.

As shown in FIG. 10, an injection instrument or needle 1029 can be used to inject the filler material (not shown in FIG. 10) into the ports 927. Various techniques and processes can be implemented to improve the injection process. For instance, the orientation of the frame 902 can be changed or shifted to aid the filler reach its intended final location. In some examples, the size of the ports 927 can be sufficient to receive a tip of the needle 1029. By inserting a tip of the needle 1029 into the port 927, the needle 1029 can be securely held in place while the filler material is injected, reducing spillage of the filler material. In some examples, the needle 1029 can be configured to form a seal around the port 927 to reduce spillage of the filler material. In some examples, the ports 927 and vents 928 are sealed by the filler (e.g., the filler completely occludes the apertures of the ports 927 and vents 928). Further details of an example electronic device are provided below with reference to FIGS. 11A and 11B.

Figure 11A:
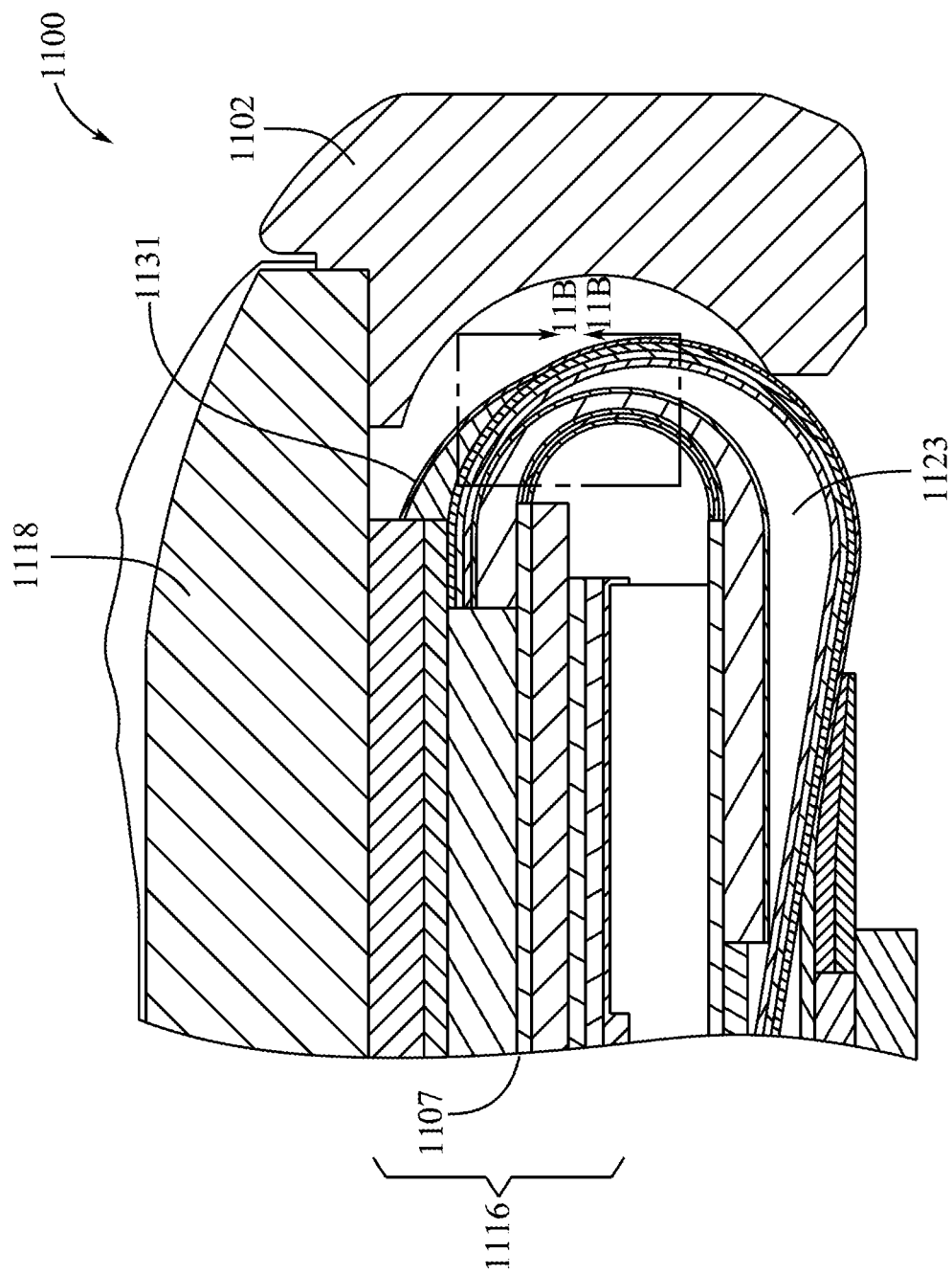
FIG. 11A shows a side cross-sectional view of internal components of an electronic device.

FIG. 11A shows a cross-sectional side view of an electronic device 1100. The electronic device 1100 can be substantially similar to, and include some or all of the features of any of the electronic devices discussed herein, such as electronic devices 800 and 900. In some examples, the electronic device 1100 includes a display assembly 1116 including a display layer 1107 and a contact component (not shown), such as a flex connector, in electrical communication with the display layer 1107. In some examples, a coating 1131 can at least partially cover the display layer 1107 and the contact component. The coating 1131 can conform to the general exterior shape of the display assembly and/or contact component. In some examples, the coating 1131 can define an orifice positioned at a contact region of the contact component. In some examples, the coating 1131 can include parylene-N. The coating 1131 can enable the display assembly 1116 to be submerged in water without damaging the display assembly 1116

Figure 11B:
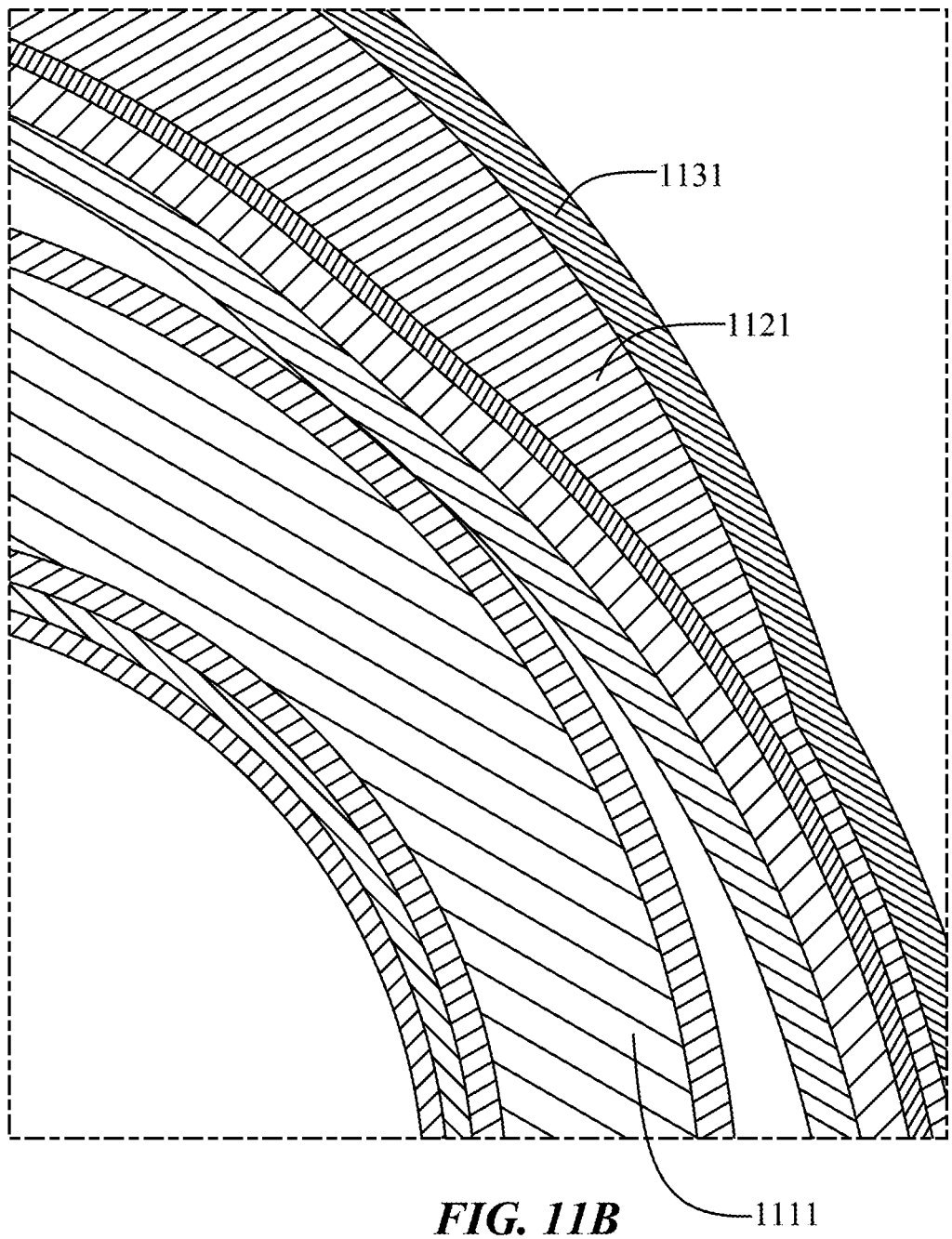
FIG. 11B shows an enlarged side cross-sectional view of internal components of FIG. 12A.

As is also shown in FIG. 11B, the conformal coating 1131 can at least partially cover a protective epoxy or filler material 1123. In some examples, the coating 1131 is applied by a vapor deposition process, such as a chemical vapor deposition (CVD). The coating 1131 can have a thickness of about 1 micron to about 5 microns, or about 2 microns to about 3 microns. In some examples, the coating 1131 has a thickness of greater than 5 microns. In some examples, the coating 1131 has a thickness of 1 micron or less. In some examples, a masking is applied to region at which no coating 1131 is desired. In this manner the masked regions can prevent the application on the coating 1131 onto the region that was masked. In some examples, masking is applied to at least one of cosmetic surfaces, the user interface side of the cover glass, flex attachment interfaces, or board to board connectors. An example process flow diagram is provided below with reference to FIG. 12.

Figure 12:
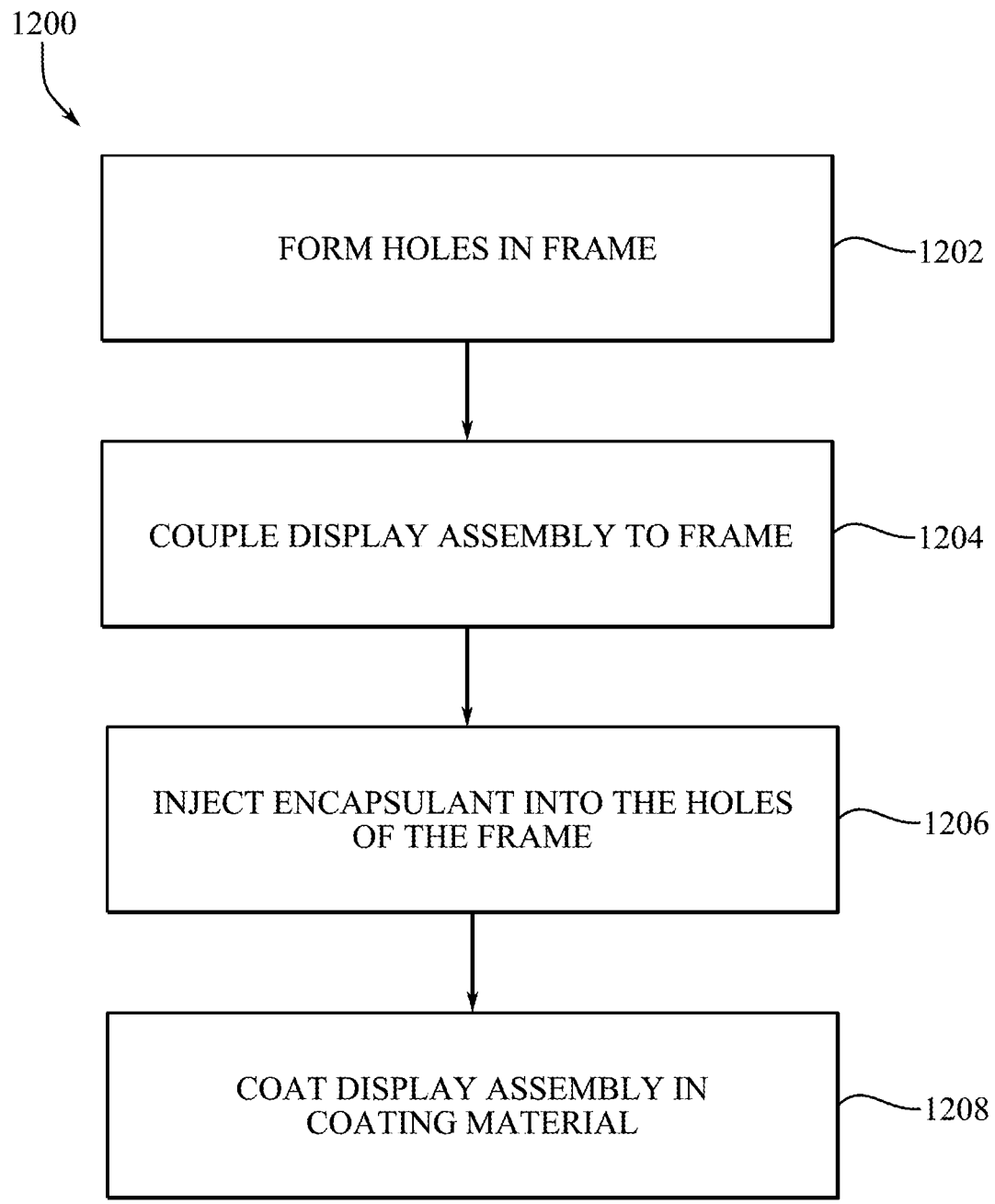
FIG. 12 shows a process flow diagram.

FIG. 12 shows a process 1200 for improving the robustness of an electronic device according to one example. At block 1202, holes are formed in the frame. The holes can include injection ports to deposit an encapsulating filler material, such as an epoxy, and also vent ports to expel displaced air. As discussed above, the holes can be machines into the frame or can be made concurrently with formation of the frame itself. The number, size, and location of the holes can be dependent on the characteristics of the filling material and the geometry of the electronic device.

At block 1204, the frame can be coupled with the display assembly. Coupling of the frame and the display assembly can be accomplished in a number of way, such as through adhesion or mechanical fastening. At block 1206, the encapsulant or filler material can be injected into the formed holes in the frame. In some examples, injection occurs sequentially, with only one hole being filled at a time. In other examples, the injection of the filler material can be done at multiple locations simultaneously. The amount of encapsulant or filler that is deposited at any given location can depend on the internal component and volume that is proximate that fill location. At block 1208, a coating material can be applied to at least one of the frame, display assembly, or filler. The coating material can be parylene that is deposited by means of chemical vapor deposition (CVD).

To the extent applicable to the present technology, gathering and use of data available from various sources can be used to improve the delivery to users of invitational content or any other content that can be of interest to them. The present disclosure contemplates that in some instances, this gathered data can include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data can be used to provide insights into a user's general wellness, or can be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data can be governed by federal and/or state laws, such as the Health Insurance Portability and Accountability Act (HIPAA); whereas health data in other countries can be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user can be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification can be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device comprising:
   a frame defining an aperture;
   a display component positioned in the aperture and configured to present visual information, the display component defining a bend region;
   a filler material at least partially surrounding a periphery of the display component, the filler material contacting the bend region and contacting a portion of the frame defining the aperture.

2. The electronic device of claim 1, wherein the filler material comprises epoxy.

3. The electronic device of claim 1, further comprising a housing at least partially defining an internal volume, wherein the frame is secured to the housing and the filler material defines a seal between an ambient environment and the internal volume.

4. The electronic device of claim 1, further comprising a housing at least partially defining an internal volume, wherein the frame is secured to the housing and the filler material defines a tortuous leak path between an ambient environment and the internal volume.

5. The electronic device of claim 1, further comprising a parylene coating covering at least one of the display component or the filler material.

6. The electronic device of claim 1, further comprising a housing at least partially surrounding and secured to the frame.

7. The electronic device of claim 1, wherein the frame defines ports for injecting the filler material between the frame and the display component.

8. The electronic device of claim 1, wherein the filler material is curable.

9. The electronic device of claim 1, wherein the bend region defines a curved surface; and
   the filler material comprises a potting material that is positioned in the bend region and in contact with the curved surface.

10. The electronic device of claim 1, wherein the filler material has a modulus of about 10 megapascals to about 20 megapascals.

11. A display assembly, comprising;
    a frame comprising sidewalls that define ports and an aperture;
    a display component defining a bend region, the display component configured to display information and positioned in the aperture, the display component and the frame at least partially defining a volume;
    a flowable filler material at least partially surrounding a periphery of the display component and positioned in the volume, the filler material contacting the bend region and contacting one of the sidewalls.

12. The display assembly of claim 11, wherein the filler material has a non-uniform thickness.

13. The display assembly of claim 11, wherein the filler material adheres to the frame.

14. The display assembly of claim 11, wherein the filler material occupies substantially all of the volume.

15. The display assembly of claim 11, wherein the filler material is non-reactive to moisture.

* * * * *